United States Patent [19]

Wakamatsu

[11] Patent Number: 4,879,253

[45] Date of Patent: Nov. 7, 1989

[54] METHOD FOR FABRICATING A SEMICONDUCTOR DEVICE USING A BPSG LAYER CONTAINING HIGH CONCENTRATIONS OF PHOSPHORUS AND BORON

[75] Inventor: Hidetoshi Wakamatsu, Tokyo, Japan

[73] Assignee: Oki Electric Industry Co., Ltd., Tokyo, Japan

[21] Appl. No.: 250,135

[22] Filed: Sep. 27, 1988

[30] Foreign Application Priority Data

Sep. 28, 1987 [JP] Japan .................................. 61-240629

[51] Int. Cl.$^4$ ............................................ H01L 21/90
[52] U.S. Cl. ..................................... 437/41; 437/240;
437/982; 148/DIG. 133
[58] Field of Search ............... 437/DIG. 982, 240, 41;
148/DIG. 133

[56] References Cited

U.S. PATENT DOCUMENTS

| | | | |
|---|---|---|---|
| 4,535,528 | 8/1985 | Chen et al. | 437/37 |
| 4,740,480 | 4/1988 | Ooka | 437/41 |
| 4,740,483 | 4/1988 | Tobin | 148/DIG. 112 |

OTHER PUBLICATIONS

Levy et al, "Viscous Behavior of Phosphosilicate and Borophosphosilicate Glasses in VLSI Processing", *Solid State Technology*, Oct. 1986, pp. 123-130.
Kern et al, "Chemically Vapor-Deposited Borophosilicate Glasses for Silicon Device Applications", *RCA Review*, vol. 43, Sep. 1982, pp. 423-457.
Kern et al, "Optimized Chemical Vapor Deposition of Borophosphosilicate Glass Films", *RCA Review*, vol. 46, Jun. 1985, pp. 117-152.
"Solid State Technology, the Japanese edition, Dec. 1986, pp. 54-59".
"*J. Electrochem. Soc.*, Solid-State Science and Technology", pp. 1517-1518, Jul. 1986, vol. 133, No. 7.

*Primary Examiner*—Brian E. Hearn
*Assistant Examiner*—A. Gutierrez
*Attorney, Agent, or Firm*—Wenderoth, Lind & Ponack

[57] ABSTRACT

A method for forming a smooth borophosphosilicate glass film on a semiconductor substrate is described, in which a semiconductor substrate having at least one stepped portion thereon is formed with one side of the substrate a borophosphosilicate glass layer having a defined boron content and a defined phosphorus content with a defined total content of the boron and phosphorus. The layer is subjected to thermal treatment under conditions of a temperature of not lower than 940° C. and a time of not shorter than 15 minutes in an atmospheric gas supplied at a flow rate of not lower than 19 liters/minute. As a result, the BPSG glass layer is smoothed on the surface thereof without formation of undesirable grains on the surface. This thermal treatment is particularly suitable for fabrication of a semiconductor element or device using an insulating film of the borophosphosilicate glass.

10 Claims, 13 Drawing Sheets

METHOD FOR FABRICATING A SEMICONDUCTOR DEVICE USING A BPSG LAYER CONTAINING HIGH CONCENTRATIONS OF PHOSPHORUS AND BORON

BACKGROUND OF THE INVENTION

1. Field of the Invention

The present invention relates to a method for fabricating a semiconductor device and more particularly, to a method for fabricating a semiconductor device using a boron/phosphorus silicate glass (hereinafter referred to simply as BPSG) as an insulating layer between conductive layers or between a conductive layer and a gate electrode the formation of a smooth BPSG layer on a semiconductor substrate.

2. Description of the Prior Art

A BPSG film is smoothed by thermal treatment at relatively low temperatures and has good moisture proofing. Accordingly, the BPSG film has been often used in recent years as an insulating film of semiconductor devices and has been reported, for example, in "Solid State Technology, the Japanese edition, December 1986, pp. 54–59", "J. Electrochem. Soc. Solid-state Science and Technology, pp. 1517–1518", and Japanese Laid-open Patent Application No. 53-107271.

Figure 1:
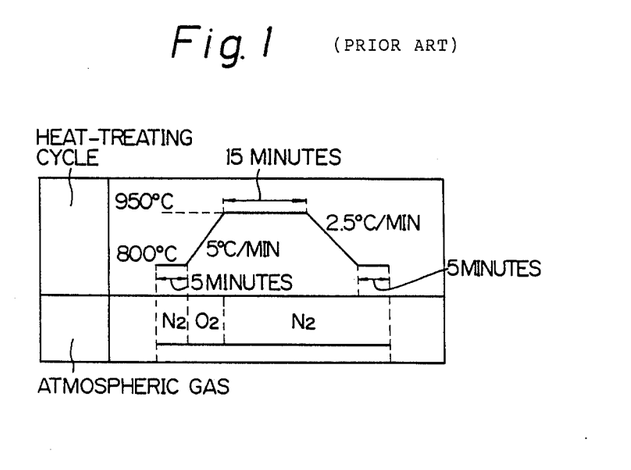
FIGS. 1 to 5 are, respectively, schematic views showing a thermal treatment cycle for a BPSG film.

However, when a 7000 angstrom thick BPSG film having a phosphorus concentration of 7 wt % and a boron concentration of 3.1 wt % is thermally treated, as is particularly shown in FIG. 1, grains grow on the surface of the BPSG film, each having approximately a diameter of 3 micrometers and a height of 1.5 micrometers.

FIG. 1 shows the condition that the BPSG film is thermally treated at 800° C. for 5 minutes in an atmosphere of $N_2$ and then heated at a rate of 5° C./minute for 30 minutes in an atmosphere of $O_2$. When the temperature reaches 950° C., the film is maintained at this temperature for 15 minutes in an atmosphere of $N_2$ and then the temperature is decreased at a rate of 2.5° C./minute for 60 minutes in an atmosphere of $N_2$. When the temperature reaches 800° C., the film is thermally treated at this temperature for 5 minutes in an atmosphere of $N_2$. It will be noted that the flow rates of the $N_2$ and $O_2$ gases in the above thermal treatment are, respectively, 9 liters/minute.

The grains have undesirably the possibility of causing breakage of a conductive layer formed on the BPSG film. Moreover, the grains may impede formation of contact holes in the BPSG film because of the difference in etching rate between the grains and the BPSG film.

SUMMARY OF THE INVENTION

An object of the present invention is to provide a method for forming on a semiconductor substrate a smooth BPSG film which is substantially free of any deposited grains on the surface thereof.

Another object of the present invention is to provide a method for forming a BPSG film having high concentrations of boron and phosphorus on a semiconductor substrate.

A further object of the present invention is to provide a method for fabricating a semiconductor device having a layer insulating BPSG film with a smooth surface.

In accordance with one embodiment of the present invention, there is provided a method for forming a smooth BPSG film on a semiconductor substrate, the method comprising the steps of:

providing a semiconductor substrate having at least one stepped portion thereon;

forming on one side of the substrate a boron/phosphorus silicate glass layer having a boron content of about 2 to 5 wt % and a phosphorus content of about from 5 to 8 wt % provided that the total content of the boron and phosphorus is in the range of from 7 to 10 wt %; and subjecting the layer to thermal treatment under conditions of a temperature of not lower than 940° C. and a time of not shorter than 15 minutes in an atmospheric gas supplied at a flow rate of not lower than 19 liters/minute whereby the silicate glass layer is smoothed on the surface thereof without formation of undesirable grains on the surface.

In a more specific embodiment, the thermal treatment is effected according to the following steps which includes:

thermally treating the BPSG layer at a temperature of approximately 800° C. for 5 minutes in an atmosphere of $N_2$ at a flow rate of not lower than 19 liters/minute;

heating the BPSG layer at a rate of about 5° C. minute from 800° C. to 950° in an atmosphere of $O_2$ at a flow rate of not lower than about 19 liters/minute;

keeping the thus heated BPSG layer at 950° C. for at least 15 minutes in an atmosphere of $N_2$ at a flow rate of not lower than 19 liters/minute; and cooling the BPSG layer from 950° C. to 800° C. at a cooling rate of about 2.5° C./minute and keeping at 800° C. for at least 5 minutes to make a BPSG layer with a smooth surface.

In accordance with another embodiment of the present invention, there is also provided a method for fabricating a semiconductor device including an insulating BPSG layer, the method comprising the steps of:

providing a semiconductor substrate having an element region and a separation region formed thereon by formation of a thermally oxidized $SiO_2$ film;

forming a gate insulating film on the element region;

forming a first conductive layer over the construction obtained in the above step;

removing the first conductive layer and the gate insulating layer selectively to expose part of the substrate;

forming a diffusion layer on the exposed portions of the semiconductor substrate;

forming, over the entire surface of the substrate obtained the above step, a boron/phosphorus silicate glass layer which contains about 2 to 5 wt % of boron and about 5 to 8 wt % of phosphorus provided that the total content is in the range of from 7 to 10 wt %;

subjecting the substrate to thermal treatment at a temperature of not lower than 940° C. for at least 15 minutes in an atmospheric gas supplied at a flow rate of not lower than 19 liters/minute so that the boron/phosphorus silicate glass layer becomes smooth on the surface thereof without formation of undesirable grains on the surface;

forming an opening in the smooth boron/phosphorus silicate layer; and forming a second conductive layer on a region including the opening.

Similar to the first embodiment, the thermal treatment is preferably effected by a procedure which comprises the steps of:

thermally treating the BPSG layer-bearing substrate at a temperature of approximately 800° C. for 5 minutes in an atmosphere of $N_2$ at a flow rate of not lower than 19 liters/minute;

heating the substrate at a rate of about 5° C./minute from 800° C. to 950° C. in an atmosphere of $O_2$ at a flow rate of not lower than 19 liters/minute;

keeping the thus heated substrate at 950° C. for at least 15 minutes in an atmosphere of $N_2$ at a flow rate of not lower than 19 liters/minute; and cooling the substrate from 950° C. to 800° C. at a cooling rate of about 2.5° C./minute and keeping at 800° C. for at least 5 minutes to make the BPSG layer with a smooth surface.

The above and other objects, features and advantages of the present invention will become more apparent from the following description taken in conjunction with the accompanying drawings.

DESCRIPTION OF THE PREFERRED EMBODIMENTS

As described before, the present invention is characterized in that when a phosphorus/boron silicate glass is used as an insulating layer, the silicate glass should have defined contents of boron and phosphorus and is thermally treated under certain temperature and time conditions at a defined range of flow rate of an atmospheric gas. By this, a smooth layer of the silicate glass which is substantially free of grains on or in the surface of the layer can be formed on a substrate.

Prior to illustration of the method of the present invention, how deposited grains are produced in or on a BPSG film is described.

Figure 2:
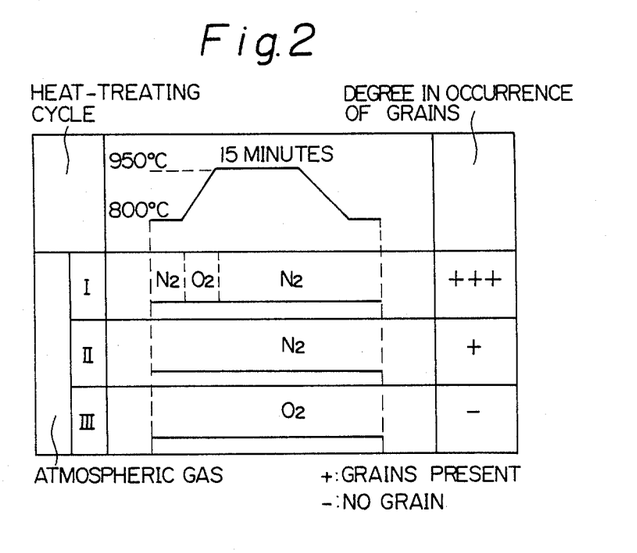

First, the degree of occurrence of grains is experimentally confirmed while changing an atmospheric gas. A 7000 angstrom thick BPSG film having a phosphorus content of 7 wt % and a boron content of 3.1 wt % as used with respect to FIG. 1 is thermally treated in the same manner as illustrated in FIG. 1 except that an atmospheric gas is changed during the course of the thermal treatment as is particularly shown in FIG. 2. The results are shown in FIG. 2. In atmospheric gas I where the thermal treatment is effected using $N_2$ and $O_2$ gases similar to that of FIG. 1, a number of grains are produced, which is indicated as mark "+ + +". When the atmospheric gas is $N_2$ alone or $O_2$ alone as in II or III, only a reduced number of grains are produced ("+") for the atmospheric gas II and no grain is produced in an atmosphere of $O_2$ ("−").

Figure 3:
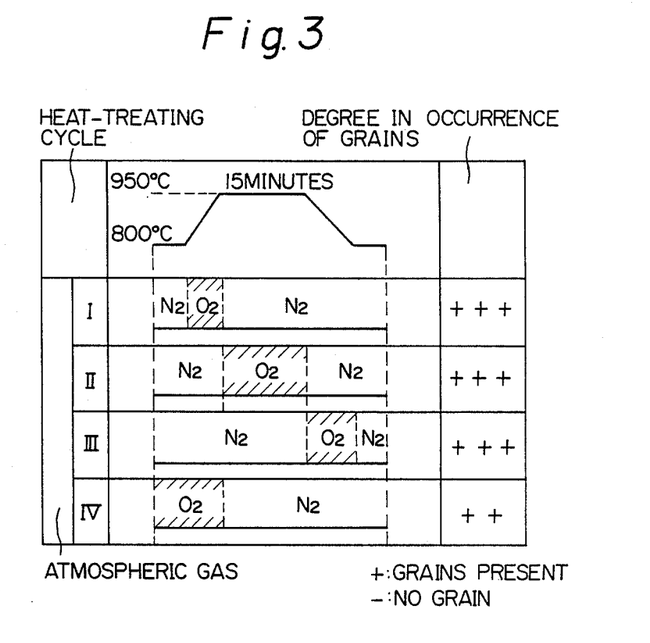

Next, an experiment is conducted under the same thermal treating conditions except that a stage of the thermal treatment at which oxygen is used is changed. This is schematically depicted in FIG. 3. Oxygen is used at the time when the thermal treating temperature rises similar to the case of FIG. 1 for experiment I, at the time of heating at 950° C. for experiment II, at the time of decreasing the temperature for experiment III, and at the time of from heating prior to the temperature rise till after the temperature rise for experiment IV. As will be seen from the results with respect to the number of grains, a significant change is not observed among the results of these experiments.

Figure 4:
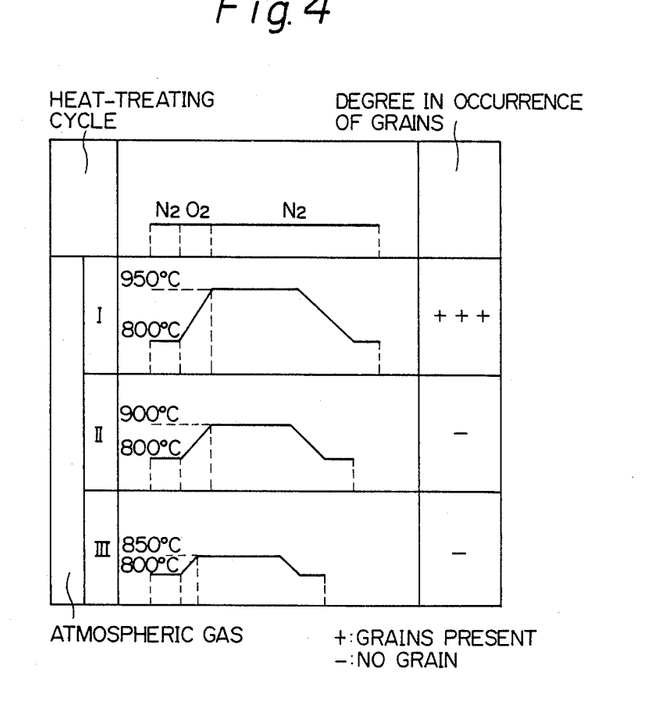

In order to confirm the effect of the thermal treating temperature, different temperatures are used as is particularly shown in FIG. 4. It will be noted that the gradients of temperature at the time of increasing and decreasing the temperature are kept constant at 5° C./minute and 2.5° C./minute, respectively, so that the increasing and decreasing times are different for the respective thermal treating temperatures.

In experiment I of FIG. 4 where the same thermal treating cycle or procedure as used in FIG. 1, a number of grains are produced, but no grain is produced in experiments II and III using 900° C. and 850° C. for the thermal treatment, respectively. This reveals that grains are unlikely to be produced at lower temperatures.

Figure 5:
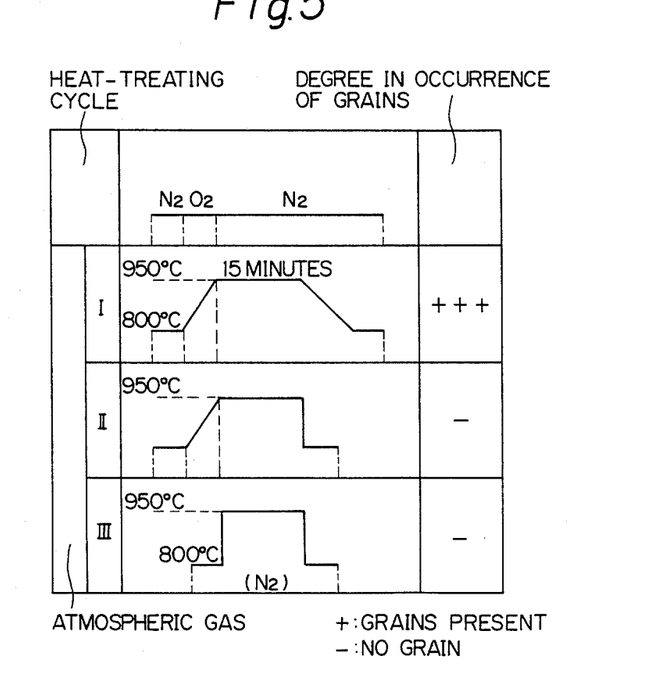

Moreover, the thermal treatment procedure as used in FIG. 1 is effected except that increasing and decreasing temperature rates alone are changed as is particularly shown in FIG. 5. It will be seen from FIG. 5 that when the temperature is abruptly decreased after the thermal treatment at 950° C. for 15 minutes, no grain is formed. Moreover, when the treating temperature is abruptly increased and decreased as in experiment III, no grain is formed. In experiment III, $N_2$ gas alone is used throughout the thermal treatment procedure.

Figure 6:
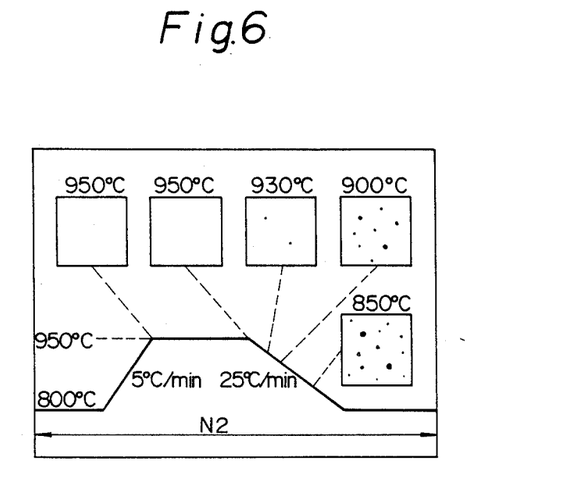
FIG. 6 is a schematic view showing occurrence of deposited grains in relation to the variation in thermal treating temperature.

For checking a stage where grains are produced, the thermal treatment is effected under the same temperature conditions as in FIG. 1 in an atmosphere of $N_2$ gas. Formation of grains on or in the BPSG film is microscopically observed at 950° C. immediately after the temperature reaches 950° C., at 950° C. immediately before the temperature is decreased, and at 930° C., 900° C. and 850° C. during the temperature-decreasing stage. This is particularly illustrated in FIG. 6, revealing that grains are formed during the time of decreasing the temperature.

Figure 7:
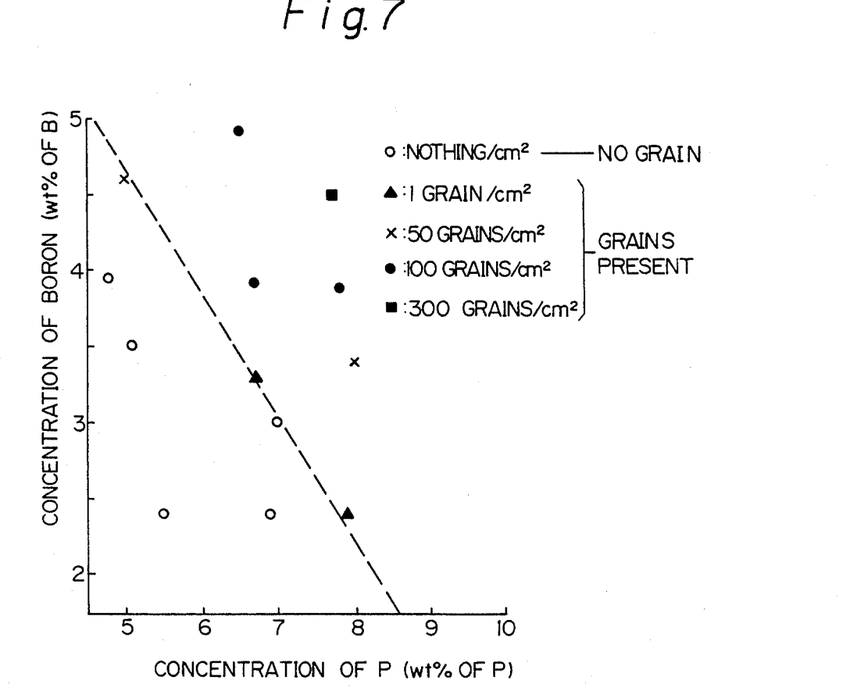
FIG. 7 is a graphical representation of occurrence of grains in relation to the variation in phosphorus and boron concentrations.

The influence of concentrations of boron and phosphorus in BPSG on the formation of deposited grains is experimentally confirmed. BPSG materials having varying contents of boron and phosphorus are thermally treated under conditions as used in FIG. 1 to determine the number of grains in the respective BPSG materials. The results are shown in FIG. 7, in which a dotted line indicates a border line as to whether or not grains are formed. From the figure, it will be seen that when the total content of boron and phosphorus is not larger than about 10 wt %, no grain develops. In this connection, however, when a boron content is 2 wt % or below and a phosphorus content is 5 wt % or below, the resultant BPSG film does not function as a BPSG film used in the practice of the invention. Accordingly, the BPSG useful in the present invention should have a boron content of from 2 to 5 wt % and a phosphorus content of from 5 to 8 wt %. In addition, the total content should be from 7 to 10 wt %.

Figure 8:
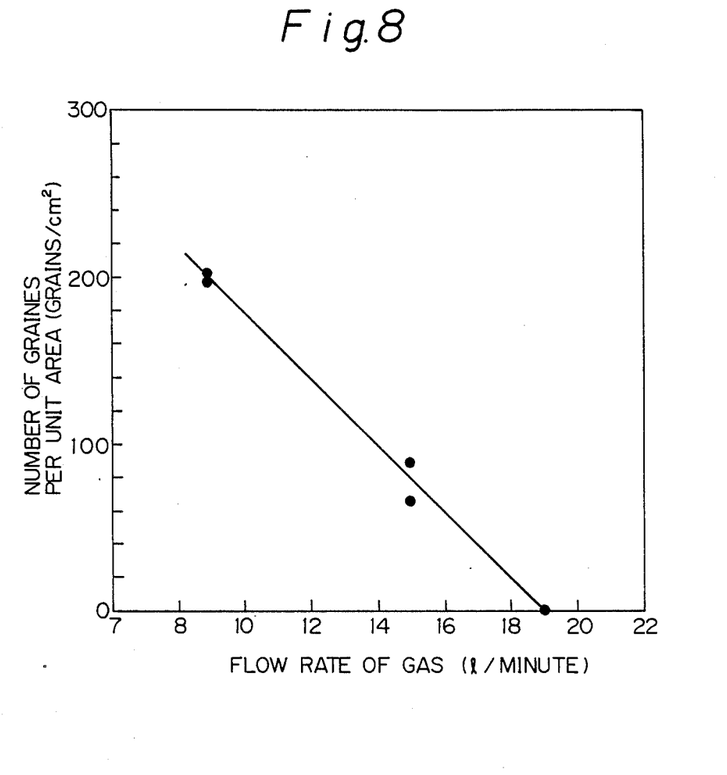
FIG. 8 is a graphical representation of the number of grains per unit area in relation to the variation in flow rate of a gas at the time of thermal treatment.

Further, in order to determine the relationship between the deposited grains and the gas flow rate at the time of thermal treatment, an experiment is carried out under the same conditions as in FIG. 1 except that the gas flow rate is changed. The results are shown in FIG. 8, revealing that no grain develops when the flow rate is not lower than 19 liters/minute. Similar results are obtained when oxygen is used instead of nitrogen gas.

The above experiments are conducted from the standpoint of deposition of grains. A BPSG film is usually thermally treated to make a smooth surface, and is then formed with a through-hole by a photolithography.

Figure 9:
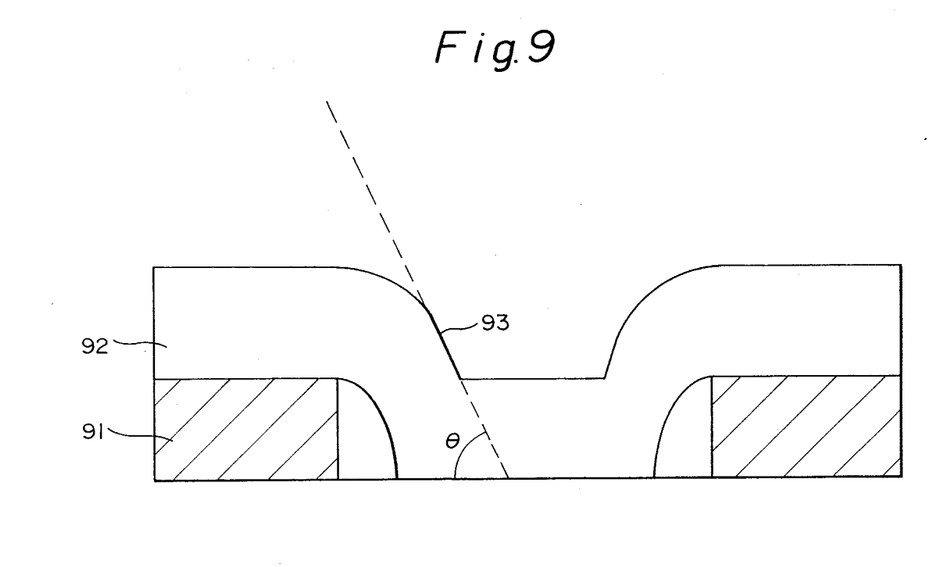
FIG. 9 is an illustrative view of a flow angle of the BPSG film obtained after thermal treatment.
Figure 10:
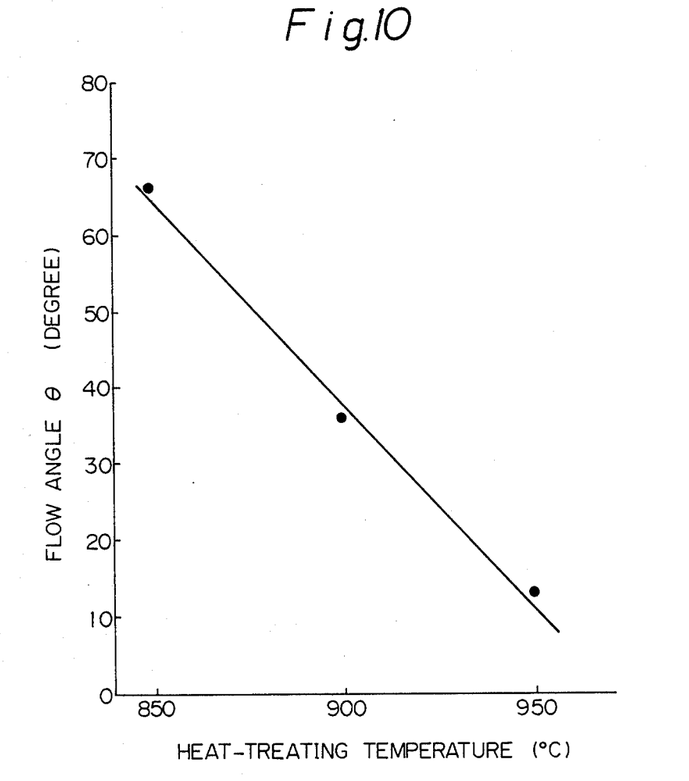
FIG. 10 is a graphical representation of a flow angle of a BPSG film in relation to the variation in thermal treating temperature.

In order to test the smoothness of a thermally treated BPSG film, the following test is conducted as is particularly shown in FIG. 9. A layer 91 having a thickness of 6000 angstroms and an opening as shown is provided, on which a BPSG film 92 having a boron content of 3.0 wt % and a phosphorus content of 7.0 wt % is grown to a thickness of 7000 angstroms to cover the opening. The film 92 is subsequently thermally treated at 850° C. to 950° C. in an atmosphere of nitrogen gas for 30 minutes. An angle, $\theta$, at a stepped portion 93 of the BPSG film 91 is measured. The results are shown in FIG. 10. When the angle exceeds 20°, the portion is too stepped, so that the photolithography is not possible. As will become apparent from FIG. 10, the thermal treating temperature should be not lower than 940° C.

Figure 11:
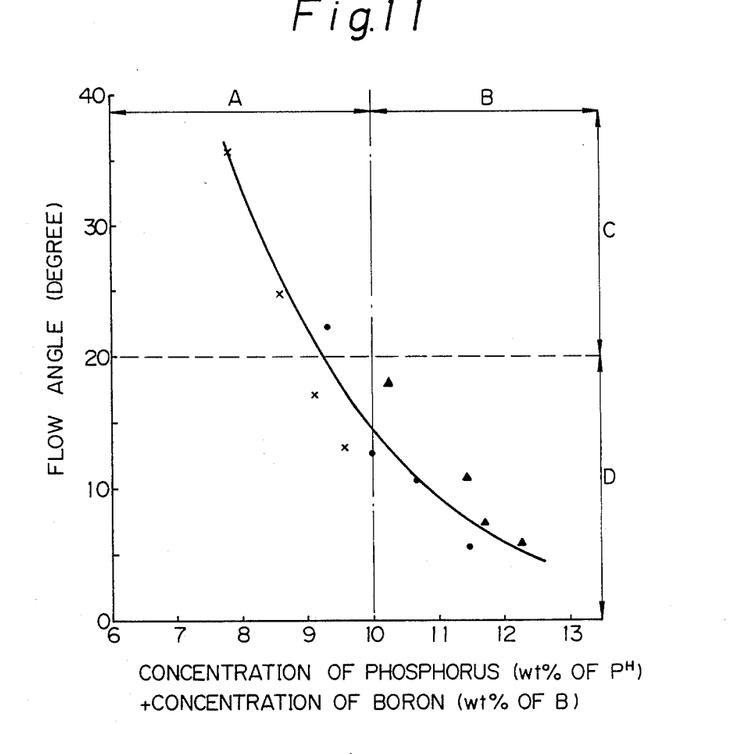
FIG. 11 is a graphical representation of a flow angle in relation to the variation in the total content of phosphorus and boron.

Based on the results of the foregoing experiments, an experiment is conducted in which the thermal treatment is effected in the same manner as in FIG. 1 using flow rates of $N_2$ and $O_2$ of 19 liters/minute with a BPSG film thickness of 7000 angstroms but the contents of boron and phosphorus are varied. The experimental results are shown in FIG. 11 in which the flow angle is plotted against the total content of phosphorus and boron. In this figure, no grains are formed in region A, but are developed in region D. In region C, the photolitho is not possible but the photolitho is possible in region in D. Ideal conditions for forming a BPSG film is an overlap region of regions A and D. From the experimental results, the total content of phosphorus and boron is preferably in the range of from 9 to 10 wt %.

Gathering the foregoing, the method according to the first embodiment comprises forming a BPSG film having a boron content of from about 2 to 5 wt % and a phosphorus content of from 5 to 8 wt % with a total content of from 7 to 10 wt % on a semiconductor substrate having at least one stepped portion, and thermally treating the film at a temperature of not lower than 940° C. for 15 minutes in an atmosphere of a gas at a flow rate of not lower than 19 liters/minute. As a result, a smooth BPSG film is obtained. The gas used may be nitrogen or oxygen.

The good conditions of formation of a BPSG film confirmed from the foregoing experiments, i.e. a BPSG film having a total content of phosphorus and boron of 10 wt %, are applied so as to make a semiconductor device using the BPSG film. This is described with reference to FIGS. 12a to 12f.

Figure 12A:
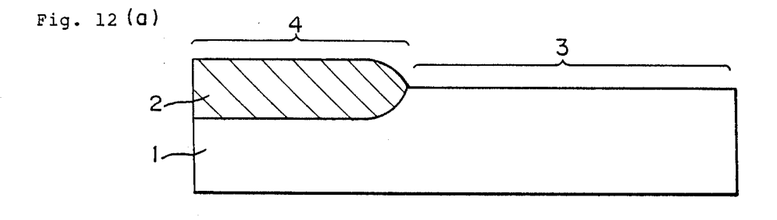
FIGS. 12a to 12f are, respectively, sectional views of a semiconductive device fabricated according to the method of the present invention.

As shown in FIG. 12a, a p-type Si substrate 1 having a specific resistance of from 4 to 6 ohms-cm is provided, on which a thermally oxidized $SiO_2$ film 2 is selectively formed in a thickness of from 4000 to 6000 angstroms to form an active region 3 and an isolation region 4.

Figure 12B:
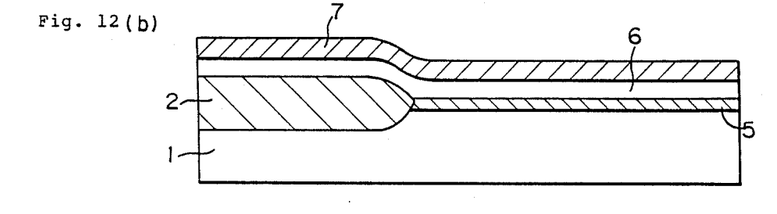

Subsequently, a 200 to 400 angstrom thick gate insulating film 5 such as, for example, of thermally oxidized $SiO_2$ film is formed on the active region 3 as shown in FIG. 12b. Thereafter, a polycrystalline silicon film 6 to which phosphorus is added is formed in a thickness of approximately 1500 angstroms on the thermally oxidized film 2 and the gate insulating film 5 by a reduced pressure vapor phase growth technique, on which a tungsten silicide 7 is formed in a thickness of from 2000 to 3000 angstroms by a reduced pressure vapor growth technique.

Figure 12C:
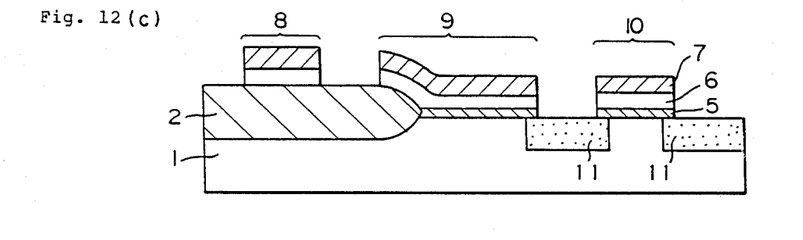

In FIG. 12c, the gate insulating film 5, polycrystalline silicon film 6 and tungsten silicide film 7 are subjected to photolithography and etched to selectively remove them, thereby forming a wiring 8, a capacitance 9 and a gate electrode 10. Further, an impurity such as As is introduced locally into the Si substrate to an extent of $1 \times 10^6/cm^2$ by ion implantation to form N-type diffusion layers 11 as shown in FIG. 12c.

Figure 12D:
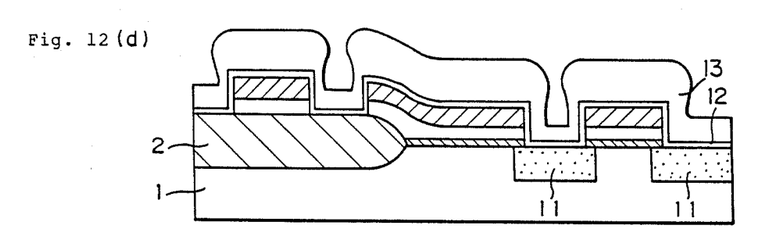

An silicon oxide film 12 is formed over an entire surface of the structure obtained by the above process in a thickness of 1000 to 2000 angstroms by a normal pressure vapor phase growth technique as is shown in FIG. 12d. Subsequently, a BPSG film 13 is formed on the silicon oxide film 12 in a thickness of from 6000 to 8000 angstroms by a normal pressure vapor phase growth technique. The BPSG film 13 has a boron content of 3.0 wt % and a phosphorus content of 7.0 wt % The BPSG film is grown at a temperature of about 400° C. from $SiH_4$ (monosilane) at a flow rate of 20 to 70 cc/minute, $PH_3$ (phosphine) at a flow rate of from 700 to 900 cc/minute and $B_2H_6$ (diborane) at a flow rate of from 600 to 1000 cc/minute and $O_2$ (oxygen) at a flow rate of from 800 to 1200 cc/minute by the use of a $N_2$ (nitrogen) as a carrier gas at a flow rate of 1000 cc/minute by a normal pressure vapor phase growth technique.

Figure 12E:
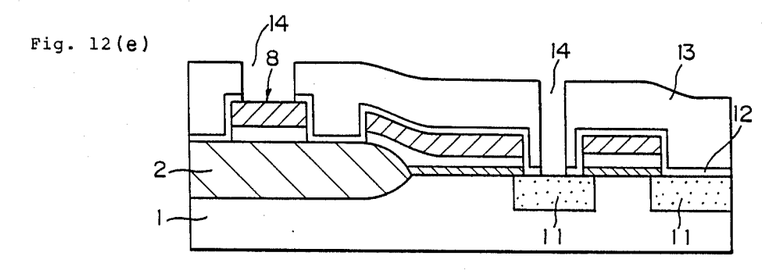

In the step of FIG. 12e, the BPSG film 13 is thermally treated to make a smooth surface. This thermal treatment is effected in a similar thermal treating cycle as in FIG. 1 in which the film is first thermally treated at 800° C. for 5 minutes in an atmosphere of $N_2$ gas, heated in an atmosphere of $O_2$ gas at a rate of 5° C./minute to a temperature of 950° C., changing the atmosphere to $N_2$ gas and thermally treated at 950° C. for 15 minutes, cooled at a rate of 2.5° C./minute to a temperature of 800° C., and thermally treated at 800° C. for 5 minutes. In this connection, however, the flow rates of the $O_2$ and $N_2$ gases in the respective steps should be 19 liters/minute or over, by which formation of grains in or on the film 13 can be prevented.

By the above thermal treatment, the glass flow takes place thereby making a smooth surface of the BPSG film 13, whereupon it has been confirmed that no grains are deposited on the film surface with a good flow angle of about 10°. Next, the silicon oxide film 12 and the BPSG film 13 are partially etched to form contact holes 14 for electric connection of the wiring 8, diffusion layer 11 and an upper Al wiring.

Figure 12F:
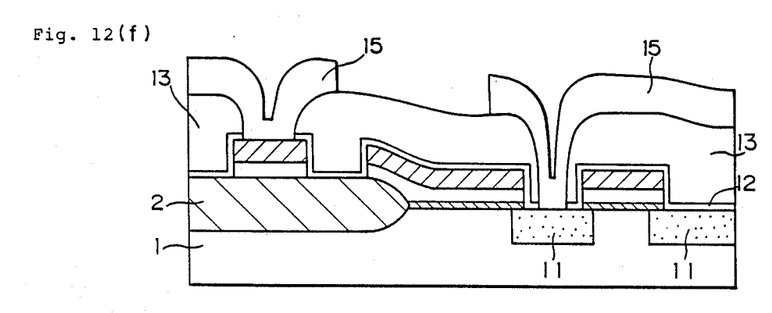

In a next step shown in FIG. 12f, a thermal treatment at 800° to 900° C. in an atmosphere of $N_2$ for 20 to 30 minutes is effected to cause glass flow again to convert the sharp walls of the contact holes 14 into dull tapered walls. Subsequently, an upper metal layer such as Al containing Si is formed over the entire surface in a thickness of from 6000 to 8000 angstroms by sputtering. The upper metal layer is subjected to photolithography and etched to partially remove the layer to form an upper metal wiring 15.

As will become apparent from the foregoing, formation of fine grains can be completely suppressed according to the method of the present invention to obtain a semiconductor element with a smooth surface. This is advantageous in that short-circuiting or breakage of an upper metal wiring formed in a subsequent step can be avoided with an improved yield. Thus, highly reliable semiconductor elements can be obtained.

Although the invention has been described in its preferred form with a certain degree of particularity, it is to be understood that many variations and changes are possible in the invention without departing from the scope thereof.

What is claimed is:

1. A method for forming a smooth borophospholisilicate glass film on a semiconductor substrate, the method comprising the steps of:
   (a) providing a semiconductor substrate having at least one stepped portion thereon;
   (b) forming on one side of the substrate a borophosphosilicate glass layer having a boron content of about 2 to 5 wt % and a phosphorus content of about from 5 to 8 wt % provided that the total content of the boron and phosphorus is in the range of from 7 to 10 wt %; and
   (c) subjecting the layer to thermal treatment under conditions of a temperature of not lower than 940° C. and a time of not shorter than 15 minutes in an atmospheric gas supplied at flow rate of not lower than 19 liters/minute whereby the silicate glass layer is smoothed on the surface thereof without formation of undesirable grains on the surface.

2. A method for forming a smooth borophosphosilicate glass film on a semiconductor substrate according to claim 1, wherein the thermal treatment comprises the steps of:
   (a) thermally treating the borophosphosilicate glass layer at a temperature of approximately 800° C. for 5 minutes in an atmosphere of $N_2$ at a flow rate of not lower than 19 liters/minute;
   (b) heating the borophosphosilicate glass layer at a rate of about 5° C./minute from 800° C. to 950° C. in an atmosphere of $O_2$ at a flow rate of not lower than about 19 liters/minute;
   (c) keeping the thus heated borophosphosilicate glass layer at 950° C. for at least in an atmosphere of $N_2$ at a flow rate of not lower than 19 liters/minute; and
   (d) cooling the borophosphosilicate glass layer from 950° C. to 800° C. at a cooling rate of about 2.5° C./minute and keeping at 800° C. for at least 5 minutes to make a borophosphosilicate glass layer with a smooth surface.

3. A method for forming a smooth borophosphosilicate glass film on a semiconductor substrate according to claim 1, wherein the borophosphosilicate glass layer has a boron content of 3 wt % and phosphorus content of 7 wt %.

4. A method for forming a smooth borophosphosilicate glass film on a semiconductor substrate according to claim 1, wherein the atmospheric gas is a nitrogen gas.

5. A method for forming a smooth borophosphosilicate glass film on a semiconductor substrate according to claim 1, wherein the atmospheric gas is an oxygen gas.

6. A method for fabricating a semiconductor device including an insulating borophosphosilicate glass layer, the method comprising the steps of:
   (a) providing a semiconductor substrate having an element region and a separation region thereon by formation of a thermally oxidized $SiO_2$ film;
   (b) forming a gate insulating film on the element region;
   (c) forming a first conductive layer over the construction obtained in the above step;
   (d) removing the first conductive layer and the gate insulating layer selectively to expose part of the substrate;
   (e) forming a diffusion layer on the exposed portions of the semiconductor substrate;
   (f) forming, over the entire surface of the substrate obtained the above step, a borophosphosilicate glass layer which contains about 2 to 5 wt % of boron and about 5 to 8 wt % of phosphorus provided that the total content is in the range of from 7 to 10 wt %;
   (g) subjecting the substrate to thermal treatment at a temperature of not lower than 940° C. format least 15 minutes in an atmospheric gas supplied at a flow rate of not lower than 19 liters/minute so that the borophosphosilicate glass layer becomes smooth on the surface thereof without formation of undesirable grains on the surface;
   (h) forming an opening in the smooth borophosphosilicate layer; and
   (i) forming a second conductive layer on a region including the opening.

7. A method for fabricating a semiconductive device including an insulating borophosphosilicate glass layer according to claim 6, wherein the thermal treatment comprises the steps of:
   (a) thermally treating the borophosphosilicate glass layer-bearing substrate at a temperature of approximately 800° C. for 5 minutes in an atmosphere of $N_2$ at a flow rate of not lower than 19 liters/minute;
   (b) heating the substrate at a rate of about 5° C./minute from 800° C. to 950° C. in an atmosphere of $O_2$ at a flow rate of not lower than 19 liters/minute;
   (c) keeping the thus heated substrate at 950° C. for at least 15 minutes in an atmosphere of $N_2$ at a flow rate of not lower than 19 liters/minute; and
   (d) cooling the substrate from 950° C. to 800° C. at a cooling rate of about 2.5° C./minute and keeping at 800° C. for at least 5 minutes to make the borophosphosilicate glass layer with a smooth surface.

8. A method for fabricating a semiconductive device including an insulating borophosphosilicate glass layer according to claim 6, where in the first conductive layer includes a polycrystalline silicon layer to which phosphorus is added and a tungsten silicide layer.

9. A method for fabricating a semiconductive device including an insulating borophosphosilicate glass layer according to claim 6, wherein the borophosphosilicate glass layer is formed from $SiH_4$, $PH_3$, $B_2H_6$, and $O_2$ by a normal vapor phase growth technique.

10. A method for fabricating a semiconductive device including an insulating borophosphosilicate glass layer according to claim 6, wherein the borophosphosilicate glass layer has a thickness of about 7000 angstroms.

* * * * *